(12) United States Patent
Bolt

(10) Patent No.: US 8,426,778 B1
(45) Date of Patent: Apr. 23, 2013

(54) TUNABLE-ILLUMINATION REFLECTOR OPTICS FOR UV CURE SYSTEM

(75) Inventor: Bryan Bolt, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 1525 days.

(21) Appl. No.: 12/001,348

(22) Filed: Dec. 10, 2007

(51) Int. Cl.
*F27B 5/14* (2006.01)
*F27B 5/18* (2006.01)
*F21V 7/10* (2006.01)
*F21V 7/16* (2006.01)

(52) U.S. Cl.
USPC ............ 219/405; 219/409; 219/411; 392/422

(58) Field of Classification Search ........................ None
See application file for complete search history.

(56) References Cited

U.S. PATENT DOCUMENTS

| | | |
|---|---|---|
| 3,504,181 A | 3/1970 | Campbell et al. |
| 4,563,589 A | 1/1986 | Scheffer |
| 4,654,226 A | 3/1987 | Jackson et al. |
| 4,872,947 A | 10/1989 | Wang et al. |
| 5,005,519 A | 4/1991 | Egermeier et al. |
| 5,166,101 A | 11/1992 | Lee et al. |
| 5,174,881 A | 12/1992 | Iwasaki et al. |
| 5,178,682 A | 1/1993 | Tsukamoto et al. |
| 5,282,121 A | 1/1994 | Bornhorst et al. |
| 5,288,684 A | 2/1994 | Yamazaki et al. |
| 5,298,939 A | 3/1994 | Swanson et al. |
| 5,354,715 A | 10/1994 | Wang et al. |
| 5,413,664 A | 5/1995 | Yagi et al. |
| 5,426,076 A | 6/1995 | Moghadam et al. |
| 5,518,959 A | 5/1996 | Jang et al. |
| 5,552,927 A | 9/1996 | Wheatly et al. |
| 5,674,783 A | 10/1997 | Jang et al. |
| 5,833,290 A | 11/1998 | Curelop et al. |
| 5,962,085 A | 10/1999 | Hayashi et al. |
| 6,015,503 A | 1/2000 | Butterbaugh et al. |
| 6,080,965 A * | 6/2000 | Osawa ........................ 219/405 |
| 6,143,063 A | 11/2000 | Hayashi et al. |
| 6,232,248 B1 * | 5/2001 | Shinriki et al. .............. 438/785 |
| 6,242,717 B1 * | 6/2001 | Sanderson .................... 219/405 |
| 6,244,575 B1 | 6/2001 | Vaartstra et al. |
| 6,259,061 B1 * | 7/2001 | Osawa ........................ 219/390 |

(Continued)

FOREIGN PATENT DOCUMENTS

| | | |
|---|---|---|
| JP | 63307740 | 12/1988 |
| JP | 01-107519 | 4/1989 |

(Continued)

OTHER PUBLICATIONS

U.S. Appl. No. 11/115,576, "Single-Chamber Sequential Curing of Semiconductor Wafers", Shrinivasan et al., filed Apr. 26, 2005.

(Continued)

*Primary Examiner* — Joseph M Pelham
(74) *Attorney, Agent, or Firm* — Weaver Austin Villeneuve & Sampson LLP

(57) ABSTRACT

The present invention provides improved apparatus for ultraviolet (UV) cure of thin films. A central external reflector (CER) reflects UV light at different angles to compensate for non-uniformity of the deposited film on the substrate. The CER is positioned between the UV light source and the substrate and includes an actuator that can change the angle of reflection before and during UV cure.

24 Claims, 8 Drawing Sheets
(2 of 8 Drawing Sheet(s) Filed in Color)

U.S. PATENT DOCUMENTS

| | | | |
|---|---|---|---|
| 6,291,800 B1 | 9/2001 | Shirakawa et al. | |
| 6,394,797 B1 | 5/2002 | Sugaya et al. | |
| 6,467,491 B1 | 10/2002 | Sugiura et al. | |
| 6,524,389 B1 | 2/2003 | Katayama et al. | |
| 6,530,380 B1 | 3/2003 | Zhou et al. | |
| 6,563,092 B1 | 5/2003 | Shrinivasan et al. | |
| 6,629,012 B1 | 9/2003 | Riley et al. | |
| 6,821,906 B2 | 11/2004 | Wada et al. | |
| 6,900,413 B2 | 5/2005 | Ratliff et al. | |
| 7,018,479 B2 * | 3/2006 | Goodwin | 118/724 |
| 7,025,831 B1 | 4/2006 | Butterbaugh et al. | |
| 7,067,819 B2 | 6/2006 | Janik | |
| 7,087,497 B2 | 8/2006 | Yuan et al. | |
| 7,094,713 B1 | 8/2006 | Niu et al. | |
| 7,097,712 B1 | 8/2006 | Yamazaki et al. | |
| 7,176,144 B1 | 2/2007 | Wang et al. | |
| 7,214,630 B1 | 5/2007 | Varadarajan et al. | |
| 7,244,672 B2 | 7/2007 | Nguyen et al. | |
| 7,256,111 B2 | 8/2007 | Lopatin et al. | |
| 7,304,302 B1 | 12/2007 | Nunan et al. | |
| 7,394,067 B1 | 7/2008 | Soltz et al. | |
| 7,638,780 B2 | 12/2009 | Kilburn et al. | |
| 7,642,205 B2 * | 1/2010 | Timans | 438/795 |
| 7,704,894 B1 | 4/2010 | Henry et al. | |
| 7,772,527 B2 * | 8/2010 | Choi | 219/405 |
| 7,935,940 B1 | 5/2011 | Smargiassi | |
| 7,960,297 B1 * | 6/2011 | Rivkin et al. | 438/800 |
| 2001/0018267 A1 * | 8/2001 | Shinriki et al. | 438/680 |
| 2002/0017242 A1 | 2/2002 | Hamaguchi et al. | |
| 2002/0117109 A1 | 8/2002 | Hazelton et al. | |
| 2002/0134439 A1 | 9/2002 | Kawasaki et al. | |
| 2002/0148563 A1 | 10/2002 | Carlson et al. | |
| 2003/0013280 A1 | 1/2003 | Yamanaka | |
| 2003/0194493 A1 | 10/2003 | Chang et al. | |
| 2003/0200931 A1 * | 10/2003 | Goodwin | 118/725 |
| 2004/0023513 A1 | 2/2004 | Aoyama et al. | |
| 2004/0082163 A1 | 4/2004 | Mori et al. | |
| 2004/0221871 A1 | 11/2004 | Fletcher et al. | |
| 2004/0266214 A1 | 12/2004 | Suguro et al. | |
| 2005/0006916 A1 | 1/2005 | Mantz | |
| 2005/0016687 A1 | 1/2005 | Shinriki et al. | |
| 2005/0072716 A1 | 4/2005 | Quiles et al. | |
| 2005/0085094 A1 | 4/2005 | Yoo | |
| 2005/0098553 A1 * | 5/2005 | Devine et al. | 219/411 |
| 2005/0196929 A1 | 9/2005 | Yuan et al. | |
| 2006/0021568 A1 | 2/2006 | Matsumoto | |
| 2006/0074153 A1 | 4/2006 | Boisseau et al. | |
| 2006/0105106 A1 | 5/2006 | Balseanu et al. | |
| 2006/0216839 A1 | 9/2006 | Shenesh et al. | |
| 2007/0034159 A1 | 2/2007 | Komino et al. | |
| 2007/0196011 A1 | 8/2007 | Cox et al. | |
| 2008/0286697 A1 | 11/2008 | Verhaverbeke et al. | |
| 2010/0267231 A1 | 10/2010 | Van Schravendijk et al. | |

FOREIGN PATENT DOCUMENTS

| | | |
|---|---|---|
| JP | 62-229833 | 10/1997 |
| JP | 11214364 | 8/1999 |
| KR | 2000-0043888 | 7/2000 |
| WO | 2006/104583 | 10/2006 |
| WO | 2006/127463 | 11/2006 |

OTHER PUBLICATIONS

U.S. Appl. No. 11/115,576, Office Action mailed Oct. 3, 2007.
U.S. Appl. No. 11/115,576, Office Action mailed May 2, 2008.
U.S. Appl. No. 11/115,576, Office Action mailed Oct. 17, 2008.
U.S. Appl. No. 11/115,576, Office Action mailed Apr. 22, 2009.
U.S. Appl. No. 11/115,576, Office Action mailed Oct. 1, 2009.
U.S. Appl. No. 11/602,564, "Method of Eliminating Small Bin Defects in High Throughput TEOS Films", Henri et al., filed Nov. 20, 2006.
U.S. Appl. No. 11/602,564, Office Action mailed Feb. 15, 2008.
U.S. Appl. No. 11/602,564, Office Action mailed Sep. 9, 2008.
U.S. Appl. No. 11/602,564, Office Action mailed Mar. 20, 2009.
U.S. Appl. No. 11/602,564, Notice of Allowance mailed Dec. 14, 2009.
U.S. Appl. No. 11/602,564, Allowed Claims.
U.S. Appl. No. 11/396,303, "Method of Reducing Defects in PECVD TEOS Films", Dhas et al., filed Mar. 30, 2006.
U.S. Appl. No. 11/396,303, Office Action mailed Dec. 14, 2007.
U.S. Appl. No. 11/396,303, Office Action mailed Aug. 6, 2008.
U.S. Appl. No. 11/396,303, Office Action mailed Mar. 19, 2009.
U.S. Appl. No. 11/396,303, Office Action mailed Oct. 28, 2009.
U.S. Appl. No. 12/008,149, "Measuring in-situ UV intensity in UV cure tool", Eugene Smargiassi, filed Jan. 8, 2008.
U.S. Appl. No. 12/008,149, Office Action mailed Mar. 17, 2010.
U.S. Appl. No. 11/115,576, Office Action mailed Apr. 15, 2010.
U.S. Appl. No. 12/726,263, "Apparatus for UV Damage Repair of Low K Films Prior to Copper Barrier Deposition", van Schravendijk, et al., filed Mar. 17, 2010.
U.S. Appl. No. 11/115,576, Office Action mailed Oct. 1, 2010.
U.S. Appl. No. 12/008,149, Notice of Allowance mailed Nov. 19, 2010.
U.S. Appl. No. 11/115,576, Office Action mailed May 9, 2011.
U.S. Appl. No. 13/070,306, "Measuring in-situ UV intensity in UV cure tool", Eugene Smargiassi, filed Mar. 23, 2011.
Kamian et al., "Ultra Violet Light Treatment Load Lock for Dielectric Films," Novellus Systems, Inc., U.S. Appl. No. 11/561,834, filed Nov. 20, 2006, pp. 1-25.
U.S. Appl. No. 11/561,834, Office Action mailed May 21, 2010.
Shrinivassan et al., "Multi-Station Sequential Curing of Dielectric Films," Novellus Systems, Inc., U.S. Appl. No. 11/688,695, filed Mar. 20, 2007.
U.S. Appl. No. 11/688,695, Office Action mailed Jun. 11, 2009.
U.S. Appl. No. 11/688,695, Final Office Action mailed Dec. 31, 2009.
U.S. Appl. No. 11/688,695, Office Action mailed Jul. 23, 2010.
U.S. Appl. No. 11/688,695, Office Action mailed Feb. 1, 2011.
Gytri et al., "Methods and Apparatuses for Reducing Porogen Accumulation from a UV-Cure Chamber," Novellus Systems, Inc., U.S. Appl. No. 12/132,559, filed Jun. 3, 2008.
U.S. Appl. No. 12/132,559, Office Action mailed Nov. 19, 2010.
U.S. Appl. No. 12/132,559, Final Office Action mailed Jun. 9, 2011.
U.S. Appl. No. 11/561,834, Final Office Action mailed Dec. 3, 2010.
U.S. Appl. No. 11/115,576, Notice of Allowance mailed Nov. 14, 2011.
U.S. Appl. No. 12/132,559, Office Action mailed Nov. 22, 2011.
U.S. Appl. No. 11/688,695, Office Action mailed Dec. 14, 2011.
U.S. Appl. No. 11/115,576, Claims as Allowed.
Shrinivasan et al., "Single-Chamber Sequential Curing of Semiconductor Wafers," Novellus Systems, Inc., U.S. Appl. No. 13/370,579, filed Feb. 10, 2012.

* cited by examiner

TUNABLE-ILLUMINATION REFLECTOR OPTICS FOR UV CURE SYSTEM

FIELD OF THE INVENTION

This invention relates to apparatus and methods for radiation treatment of thin films.

More specifically, the invention relates to apparatus and methods of using ultraviolet radiation and other process conditions to facilitate a desired change in film properties.

BACKGROUND

Many layers of thin films are used to make an integrated circuit. IC manufacturing requires thin films to have certain properties in order for the circuit to function as designed. For example, there is a general need for materials with low dielectric constants (low-k). Using low-k materials as the intermetal dielectric (i.e., the layer of insulator separating consecutive levels of the conductive metal interconnects) reduces the delay in signal propagation due to capacitive effects, otherwise know as the RC delay. A dielectric material of low dielectric constant will have low capacitance, and hence the RC delay of an IC constructed with such a material will be lower as well.

As another example, there is a general need for materials with specific tensile or compressive stresses. Increasing shallow trench isolation (STI) film tensile stress increases transistor drain current and device performance because the electron and hole mobilities are higher. Other applications require dielectric films to have compressive stress. These and other properties may be met on the film as deposited, or after treatment.

One such treatment may be a thermal process in which the substrate is heated to a temperature for a time. A thermal treatment may remove unwanted particles from the film, or change its stresses and other properties. These thermal processes, however, have certain difficulties. In particular, substrate temperatures generally need to be high (i.e., greater than about 500 degrees Celsius) with exposure times typically on the order of hours. As is well known in the field, these conditions can damage copper containing devices, especially in the application wherein a low-k dielectric is being cured and the long exposure time may be unsuitable for mass manufacturing. Also, the use of temperature sensitive nickel silicide precludes inducing film stress by using temperatures above 400° C. while some SiN films have a cure temperature up to 480° C.

To overcome these disadvantages of thermal processing, another technique has been developed, which involves curing the film with UV radiation. Irradiation of the low-k or spacer nitride films permits modulation of desired film properties such as dielectric constant or film stress at lower temperatures. However, the use of UV radiation in such processes may result in deleterious side-effects unless special care is taken to deliver the precise amount of radiation and to maintain the substrate temperature at an optimal level. Delivery of the precise amount of radiation may be complicated when the deposited film on the substrate is not perfectly uniform. A uniform UV cure may exacerbate pre-existing non-uniformity by curing less the areas that need more film property change and curing more the areas that need less film property change.

What are needed therefore are improved methods and devices for treating thin films with UV radiation to obtain desired film properties.

SUMMARY

The present invention addresses this need by providing improved apparatus and methods for ultraviolet (UV) cure of thin films. A semiconductor processing apparatus for UV cure involves a process chamber and a UV lamp assembly that includes a central external reflector. The central external reflector (CER) is one or more optical reflectors mounted in between the UV radiation source and the chamber, such that none or a portion of the UV light is reflected onto the substrate by the CER. The CER may be mounted below and in between the UV light source(s), preferably with a rotational axis parallel to a plane of the substrate, substrate holder, or the chamber window. The CER is positioned external to the process chamber, i.e., outside of the process chamber window, so that it is not affected by reactions that occurs inside the chamber. By adjusting the angles of the optical reflectors, the CER can achieve different radiation profiles on the substrate. For example, the radiation can be made substantially uniform or the substrate center can be exposed to 50% less radiation than near a substrate edge.

In one aspect, the present invention pertains to the semiconductor apparatus for irradiating a substrate with light. The apparatus may include a process chamber having a substrate holder and a window, and a UV lamp assembly. The UV light assembly is mounted on the process chamber over the window and includes one or more UV light sources and an adjustable central external reflector (CER). The CER includes one or more reflective optics mounted on a rotational adjustment mechanism. Each reflector may be mounted on its own rotational adjustment mechanism. As the mechanism rotates about an axis, the angle of UV light reflected from the reflector through the window changes. The angle of the CER is measured from a horizontal plane parallel to the substrate holder and window. At 45 degrees in a two-reflector CER, the reflectors are tilted toward each other and reflect little light because the reflectors are not in the direct light path from the light source. At 90 degrees, the reflectors are perpendicular to the substrate and a significant amount of light is reflected and prevented from reaching the center of the substrate.

The rotational adjustment mechanism may include a stepper motor and one or more reflective optics mount. The optical reflector is attached to a mount that rotates about an axis. The stepper motor moves the mount to different degree of rotation and thereby controls the angle of reflection. The reflective optics mount may be a hinge, a pivot joint, or any other mechanism that can cause an attached optical reflector to rotate. In certain embodiments, the adjustable CER also includes a translational adjustment mechanism to move the reflector and the mount along the axis.

The optical reflector is selected to reflect the radiation of interest, which may be UV radiation at wavelengths of about 150-400 nm, preferably about 200-300, and even more preferably at about 250 nm for certain applications, e.g., high tensile nitride film, and about 200-250 nm for other applications, e.g., ultra low-k film curing. The reflective optics may be a dielectric coated mirror, a metal coated mirror, or an aluminum metal coated with an oxide, e.g., silicon oxide or aluminum oxide.

In certain embodiments, the apparatus also includes a controller to execute a set of instructions. The instructions include receiving an indication of the extent of non-uniformity of a substrate or a substrate batch; determining an angle of reflection to compensate for the non-uniformity; moving the rotational adjustment mechanism to the determined angle; and, radiating the substrate with UV radiation. In other embodiments, the controller may execute a set of instructions to receive an indication of the extent of non-uniformity of a substrate or a substrate batch to be induced by the UV cure; determining an angle of reflection to induce the non-uniformity; moving the rotational adjustment mechanism to the determined angle; and, radiating the substrate with UV radiation.

In another aspect, the present invention pertains to a method of UV curing a semiconductor substrate. The method includes providing a substrate having a non-uniform film deposition into a process chamber; adjusting an angle of reflection on an adjustable central external reflector; and, exposing a substrate with UV radiation reflected by the adjustable CER. The method may also include receiving an indication of an extent of non-uniformity of a substrate or a substrate batch and determining an angle of reflection to compensate for the non-uniformity. In certain embodiments, the method can include an operation to measure substrate non-uniformity, either before or after providing the substrate in the process chamber. The UV radiation may have wavelengths of 150-400 nm.

In another embodiment, the method induces non-uniformity in a substrate as a part of an overall process flow. In such situations, it may be anticipated that subsequent processing will induce non-uniformity and the opposite non-uniformity is induced in the UV cure process to counter the effect of subsequent non-uniformity. The method then includes providing a substrate that may or may not have a non-uniform film deposition into a process chamber, receiving an indication of the non-uniformity to induce as well as any existing non-uniformity, and selecting an appropriate UV exposure sequence with CER adjustments to induce the non-uniformity desired.

The substrate is not only exposed to reflected UV radiation from the CER, but from other reflectors as well as directly from the UV light source. The total exposure is thus a sum of all the various reflections and unreflected light and is generally a percentage of the light generated. One particular advantage of this present invention is that a larger percentage of the light generated is irradiated onto the substrate than other methods to control irradiance distribution, such as attenuating filters. Having a larger percentage of the light irradiated onto the substrate is saves time, and conserves power and parts.

The total exposure distribution compensates for the non-uniformity on the substrate. As deposited film on a substrate may be uniform or non-uniform which regards to thickness, stress, amount of trapped material, and other film properties. These non-uniform properties may require more or less radiation at different locations from the center of the substrate to achieve a uniform cure. Generally, a substrate may require irradiation at the edges of the substrate and less in the center. The amount of extra radiation at the edge may vary from process to process, batch to batch, or even substrate to substrate.

One way to measure UV cure uniformity is the percentage of shrinkage. Given the same amount of material and same film properties, uniform radiation would achieve uniform shrinkage. But when the film varies in thickness or has different properties, the radiation would have to be non-uniform, i.e., compensate for the film non-uniformity, in order to achieve the same percentage of shrinkage at the substrate edge and center. In one example, the angle of reflection, i.e. at 90 degrees, may be adjusted such that the UV radiation at the substrate center is 50% of that at the substrate edge.

The angle of reflection may be fixed for the duration of the UV exposure or can be adjusted during the UV exposure so as to sweep the substrate with varying amounts of UV radiation. Additionally, a translational position of the adjustable CER may be changed before or during the UV exposure. The reflection angle and translational position may be adjusted concurrently or separately to sweep reflected UV radiation at different positions across the substrate.

The method may also include a separate operation of exposing the substrate to UV radiation at a different relative orientation of light source to substrate. In certain embodiments, the change of orientation may be effected by rotating either the substrate holder of the UV light source. In other embodiments, the substrate may be moved to a separate station that has a UV light assembly fixed at a different relative orientation. By moving the substrate through separate stations at different orientations, a uniform exposure is achieved across along perimeters of various concentric circles on the substrate surface.

These and other features and advantages of the invention will be described in more detail below with reference to the associated drawings.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION OF A PREFERRED EMBODIMENT

Introduction

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Reference will be made in detail to implementations of the present invention as illustrated in the accompanying drawings. The same reference indicators will be used throughout the drawings and the following detailed description to refer to the same or like parts. In this application, the terms "work piece," "wafer" and "substrate" will be used interchangeably. The following detailed description assumes the invention is implemented on a wafer. However, the invention is not so limited. The work piece may be of various shapes, sizes, and materials (e.g., displays of various sizes).

The present invention involves an ultraviolet (UV) irradiation apparatus for processing semiconductor substrates. UV radiation is used to treat thin films on substrates to achieve various property changes. UV radiation can break chemical bonds, change composition of material, cause chemical reactions to occur, affect density and stress, and otherwise provide energy to a substrate.

A typical implementation of UV irradiation apparatus has a number of UV lamps to illuminate a substrate. The UV lamps may be flood lamps, generating UV light in a broad range of wavelengths, or a high intensity discharge light that emits UV radiation in a smaller spectrum. Monochromatic sources of UV radiation, such as certain lasers, may also be used.

In certain implementations, two individual linear mercury bulbs are used in two individual lamp assemblies. For illuminating a 300 mm wafer, the linear bulbs are 200 mm. With a two bulb configuration, the relative orientation of the bulbs to the circular substrate is varied over time to achieve a uniform exposure for each circular section. In other words, each circular section, i.e. pie piece, of similar size substrate is exposed to a substantially similar intensity and radiation distribution as the next circular section at the end of total exposure. This may be achieved by moving substrate from station to station where each station has a different relative orientation of the bulbs to the substrate. Generally, having four stations of varying orientation is sufficient to ensure a relatively uniform UV irradiance. Uniform exposure may also be achieved by rotating the either the lamp assembly or the substrate during UV cure.

Figure 1A:
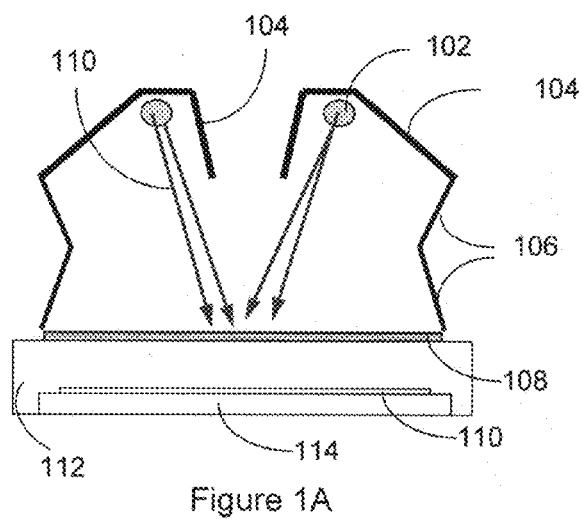
FIGS. 1A to 1D are schematics of UV lamp assembly with central external reflectors in various positions.

Various reflectors are also used in lamp assemblies to direct generated UV radiation toward the substrate. Linear bulbs generate light in all directions, but the substrate surface is only on one side of the bulb. Thus reflectors are used to direct UV radiation that would have otherwise escape from the lamp assembly toward the substrate. This way, lamp power is used more efficiently. FIG. 1A shows a cross section schematic of one implementation of two lamp assemblies. Lamp assemblies are mounted over a process chamber 112 over window 108. Linear bulbs 102 generate UV radiation in all directions. Some of the generated radiation, as shown by rays 110, directly irradiates the substrate 110, which is supported by substrate support 114. Some of the radiation is reflected off various reflectors before irradiating the substrate. Overhead reflectors 104 surround the bulb and redirect radiation toward the substrate. The ring reflector 106 surrounds the space above the process chamber window 108. In the configuration of FIG. 1A, the irradiance distribution across the substrate is substantially uniform. In other words, the film at the substrate edge experiences relatively similar amount of radiation as the film at the substrate center.

Figure 1B:
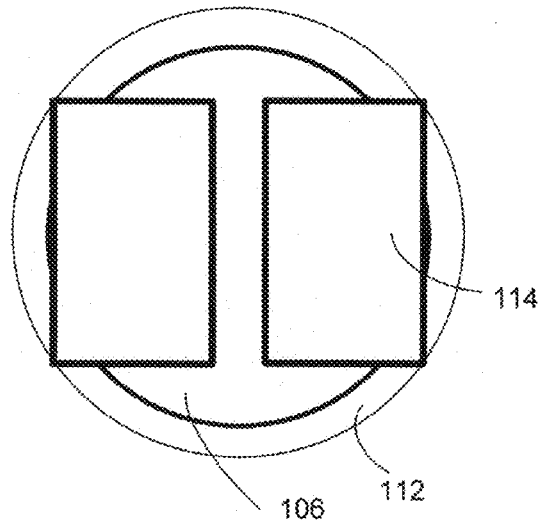

FIG. 1B shows a top view of the same lamp assembly as FIG. 1A. Lamp assembly housings 114 enclose tubular bulbs 102 and overhead reflectors 104 and are rectangular in shape. They are mounted over ring reflector 106 which sits over the process chamber 112. Design of the reflectors such that the irradiance distribution across the substrate is relatively uniform is challenging because of the different shapes of the bulb and the substrate.

As discussed above UV radiation is used to effect a number of film property changes. These changes depend on the property of film as deposited. In many instances, the as-deposited film is radially non-uniform across the substrate. In other words, the film stress at the substrate edge may be higher or lower, usually lower, than the film at the substrate center. In order to cure the film to the same extent across the substrate, the radiation has to be adjusted accordingly. One way to achieve a specific radiation distribution profile to accommodate film non-uniformity is to adjust the reflectors 104 and 106. By changing the angles in the various reflector pieces in the overhead reflectors 104 and 106, a specific non-uniform irradiance distribution can be achieved. However, this process is time consuming because mechanical parts have to be manufactured and modeled, and what works for one set of non-uniform conditions does not work for the next. This process is also costly because new hardware is manufactured for each set of non-uniform conditions and not efficient because substrate to substrate differences cannot be accommodated as the chamber needs to be taken out of service to change hardware. The adjustable central external reflector (CER) of the present invention addresses these issues by allowing in situ adjustment of irradiation distribution using one set of hardware that can be remotely controlled without shutting down the tool or taking a chamber out of service.

Apparatus

Figure 1C:
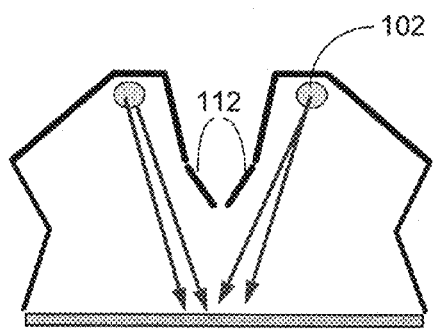

As shown in FIG. 1C, the adjustable CER 112 of the present invention may be located below and in between the lamp assemblies. The adjustable CER includes one or more rotational adjustment mechanism and one or more reflective optics mounted to the rotation adjustment mechanism. In FIG. 1C, the CER angle is set such that the reflective optics are not in the direct path of the radiation generated at the bulbs 102. As used herein, a CER angle is measured from a plane parallel to the substrate, substrate support, or chamber window. The CER angle of FIG. 1C is at about 45 degrees. The CER angle of FIG. 1D is more than 90 degrees.

Figure 1D:
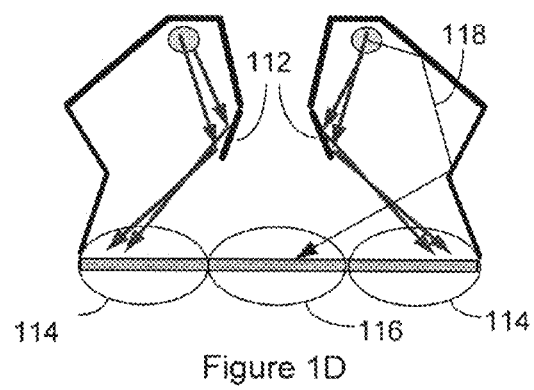

In FIG. 1D, the CER angle is set to reflect a part of the light that would have passed through a region 116 of the window to a region 114 of the window. This reflection concentrates more of the radiation toward the edge of the substrate. By changing the CER angle, the amount of additional radiation toward the edge of the substrate and the portion of the substrate having a higher intensity may be adjusted. This angle can be made so that certain irradiance distributions are achieved. The desired irradiance distribution depends on substrate uniformity data. Note that the configuration of FIG. 1D does not leave region 116 without UV radiation. As an example, reflected UV radiation shown by ray 118 from reflectors 104 and 106 reaches region 116. The total amount of radiation at region 116 with a larger CER angle is less than if the CER angle were smaller.

Figure 2A:
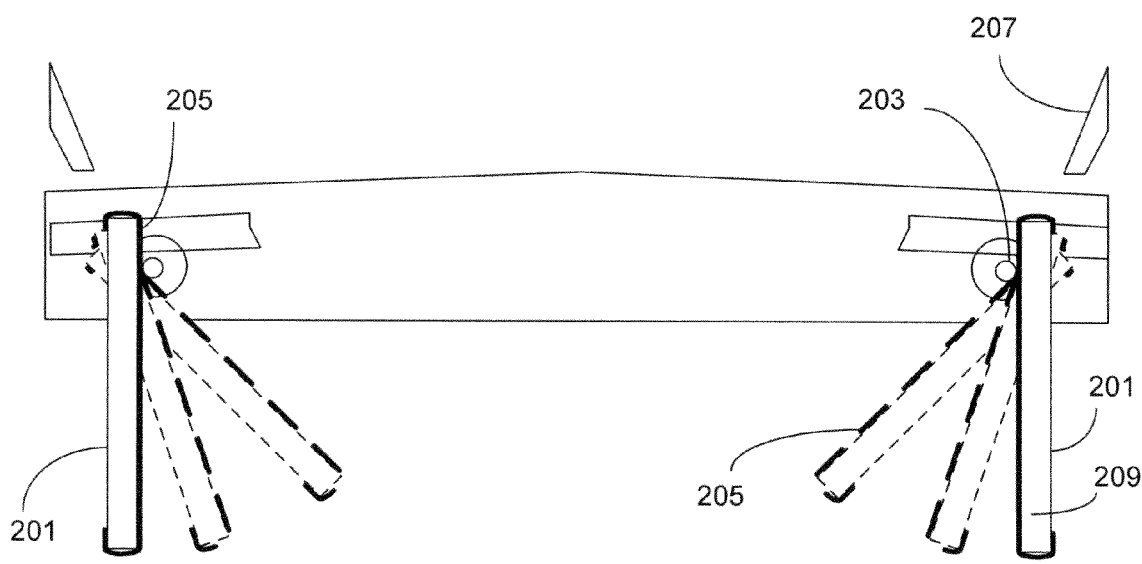
FIGS. 2A and 2B are schematics of reflector optics and mount in accordance with certain embodiments of the present invention.
Figure 2B:
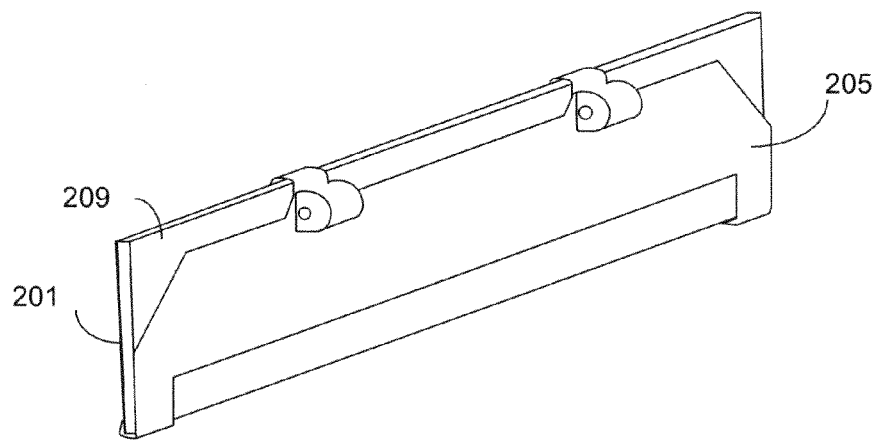

FIGS. 2A and 2B shows more detail in one implementation of how the CER may be attached. FIG. 2A shows the reflecting surface 201 attached to a reflective optics mount 205, which is attached to and rotates about point 203. The axis of rotation is into the page and is parallel to the plane of the substrate, substrate holder, and the process window. Three different CER angles are shown, with the solid lines showing a CER angle of about 90 degrees. The dotted line surface and mount show CER angles of about 45 and 75 degrees.

The reflector 209 may be a mirror made of metal or other known substance and may be reflectively coated. In some cases, dielectric material may be used to coat the surface such that only UV radiation of certain wavelengths is reflected, or is reflected more strongly. In one example, the mirror may be aluminum metal coated with silicon oxide. In other examples, the mirror may be coated with a metal. The mirror may be flat or curved, rectangular or not. Reflected UV wavelength may be at about 150-400 nm, preferably about 225-300, and even more preferably at about 250 nm. The CER surface may be made of the same material as the overhead reflectors and ring reflectors in FIG. 1 or be made of different material. Referring again to FIG. 2A, a small portion of an overhead reflector is shown as element 207. As discussed above, the overhead reflector surrounds the light bulb and directs all generated radiation toward the process window.

FIG. 2B shows one embodiment of the reflective optics and mount 205. The mount shown attaches to the reflective optics at the bottom in two places and at the top in two places. It is a hinge type mount that pivots about a rod (not shown). Other embodiments include more or fewer attachment points. The pivot point may be closer to the top of the mount, such that the optics pivot like a door, or more toward the center, such that the optics pivot about a center like a seesaw.

Figure 3A:
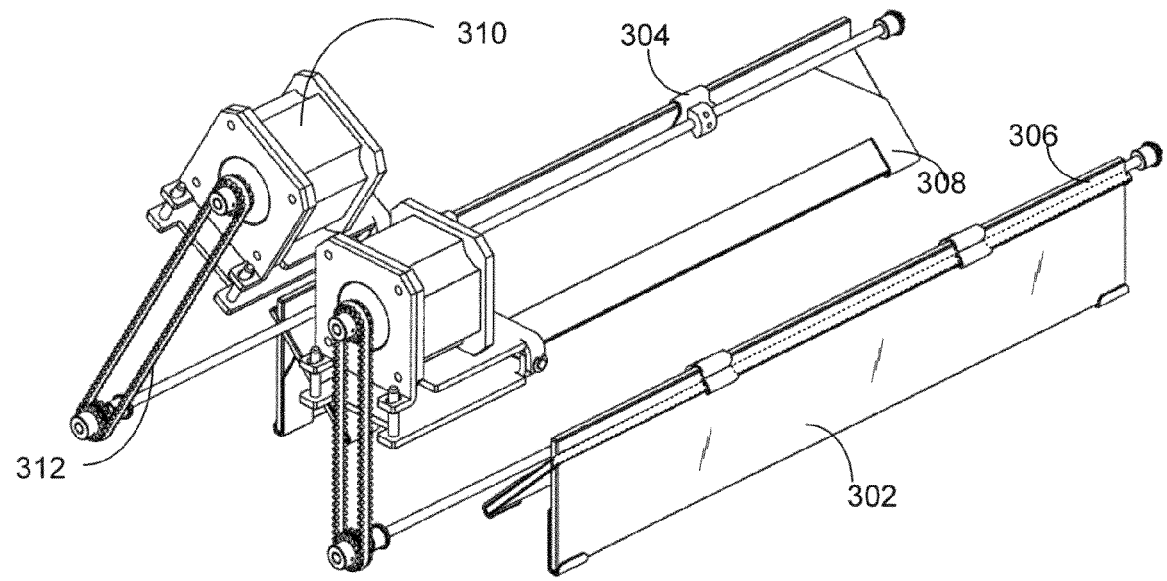
FIG. 3 is a schematic of the central external reflectors in accordance with certain embodiments of this invention.
Figure 3B:
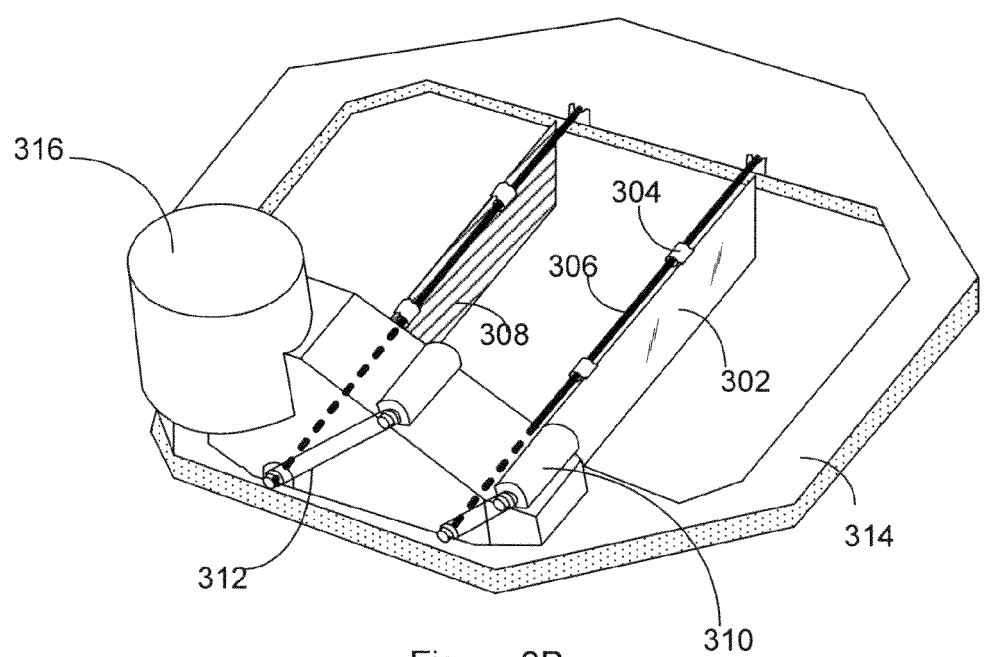

FIG. 3A shows the reflective optics and mount with one embodiment of a rotating mechanism. Stepper motors 310 turns a shaft in small steps, which moves a drive belt 312 attached to the end of an axle rod 306. The axle rod is attached to the reflective optics mount 308 via hinge connectors 304. The rotation of the axle rod 306 rotates the reflective optics 302 in the mount 308 to change the UV radiation reflection. FIG. 3B shows the same rotating mechanism over an exhaust manifold 316, which is attached to a manifold plate 314. In this embodiment, nitrogen is continuously injected and removed from the UV lamp assembly to cool the components and provide an inert environment. UV radiation contains high energy and can create ozone if oxygen is present. The reactive ozone may cause unintended reactions with lamp assembly components. Thus nitrogen or other inert gas is continuously injected into the lamp assembly. The axle rod 306 (shown by dotted lines) extends through the exhaust manifold 316.

FIGS. 3A and 3B show one embodiment of how the adjustable CER may be implemented. Other implementations are possible. For example, with a different exhaust manifold design, the stepper motor may be placed such that its shaft is in-line with the axle rod, thus rendering the drive belt unnecessary. Other types of rotating mechanism may be used, such as induction motors, brushed direct current motors, unipolar motors, and reluctance motors. If the rotating shaft is not in-line with the axle rod, mechanism other than a drive belt may be used to translate the rotating motion, such as gears and chains. One skilled in the art would be able to design an implementation of the adjustable CER with a rotational adjustment mechanism to take into account of the particular space constraints and degree of control required.

In certain embodiments, the adjustable CER includes a translational adjustment mechanism that allows the reflective optics to move along the axis of rotation or perpendicular to the axis of rotation. For example, the reflective optics may move along the axle rod of FIG. 3A to address complex substrate non-uniformity. Generally, non-uniformity across the substrate is similar regardless which diameter cross section one measures. However, in the instance where one quadrant, for example, has unique non-uniformity relative to the other quadrants, then having a translational motion to the reflector can compensate for the non-uniformity.

The reflective optics may also be configured to move perpendicular to the axes of rotation (i.e. two axes as depicted in FIG. 3A) in the same plane. Thus the reflective optics may be moved further or closer to each other. This kind of translational movement can increase or decrease the size of the region of decreased UV irradiance in the center of the substrate. When the reflective optics are close together, the region of decrease UV irradiance is smaller, and vice versa.

The adjustable CER may be connected to a controller configured to execute a set of instructions to process the substrate. The controller can move the rotational and translational adjustment mechanisms depending on the UV cure specifications for the substrate. The controller may be local to the process chamber so that only manual changes are possible. The controller may also be integrated to a semiconductor processing tool so that non-uniformity indications or specific CER angle instructions may be entered at the tool interface at a front panel.

The adjustable CER of the present invention may be implemented on a number of semiconductor processing chambers and tools. As discussed above, multiple-station sequential process chambers, multiple-station non-sequential process chambers, or single station chambers may be used. In a multiple-station chamber, a substrate is moved from station to station to ensure that it is exposed to UV radiation from a number of bulb orientations. In a single station chamber, relative movement between the UV lamp assembly and the substrate via a rotating substrate holder may be used. Additionally, a substrate can also be transferred from chamber to chamber to effect the same kind of exposure to multiple orientations as from a multiple-station chamber.

Suitable tools may be configured with one or more process chambers. Suitable semiconductor processing tools include the SOLA and modified VECTOR available from Novellus Systems, Inc. of San Jose, Calif. Other suitable semiconductor processing tools include the Centura and Producer available from Applied Materials, Inc. of Santa Clara, Calif.

Details of the UV lamp assembly, reflectors, process chamber window, and temperature control on the substrate holder may be found in commonly assigned co-pending U.S. application Ser. No. 11/688,695, titled "Multi-Station Sequential Curing of Dielectric Films", which is incorporated herein by reference in its entirety for all purposes.

For convenience, discussion of the UV lamp assembly and adjustable CER apparatus focused on a two linear bulb configuration for the UV source; however, the present invention is not so limited. For example, the adjustable CER apparatus would work with any number of bulbs, e.g., 3, 4, or 5, in any kind of configuration, e.g., parallel or end-to-end. The CER apparatus would also work with other types of bulbs, not just linear bulbs. As UV bulbs evolve and techniques to build UV lamp assemblies advance, the use of a CER apparatus to control irradiance of reflected light continues to apply.

Although discussion of the adjustable CER apparatus focused on UV cure applications, the present invention is not so limited. The adjustable CER apparatus is applicable to any radiative processing of semiconductor substrates where the need to provide non-uniform irradiance distribution exists.

Methods

Figure 4:
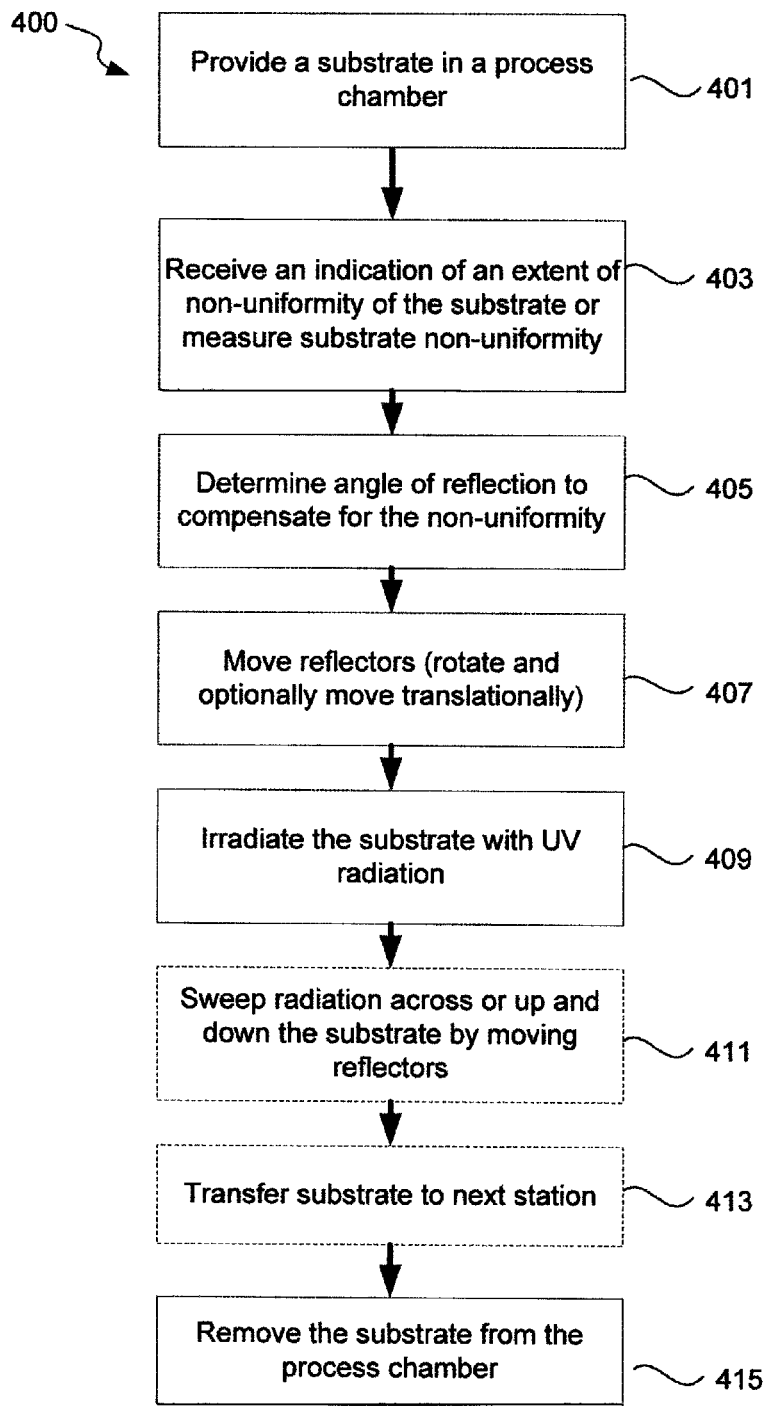
FIG. 4 is a process flow diagram depicting a process in accordance with the present invention.

In one aspect, the present invention pertains to a method to cure a semiconductor substrate with UV radiation. FIG. 4 is a process diagram depicting methods of operations in certain embodiments of the present invention. At operation 401, a substrate is provided in a process chamber. This substrate may be provided from outside of the semiconductor process tool, e.g., through a front opening unified pod (FOUP), or from another process chamber where a film is deposited onto the substrate. The apparatus receives an indication of an extent of non-uniformity of the substrate or measure the substrate non-uniformity at operation 403. In some embodiments, an operator may enter a code to indicate the extent of non-uniformity. Also, the non-uniformity information may be transmitted to the apparatus through a fabrication plant system. The indication may also be in different forms such as a distribution, a chart, or just a percentage number. In certain embodiments, the apparatus includes an in-situ metrology chamber to measure the film property of interest.

The information measured or indication received can then be fed directly to a controller that would determine an angle of reflection to compensate for the non-uniformity, at operation 405. Compensate for non-uniformity includes both UV curing uniformly and correcting the non-uniformity. In the former case, the angle of reflection is adjusted so that the curing occurs uniformly even though the substrate is not. After UV curing, the substrate is likely still non-uniform, but the curing did not exacerbate the non-uniformity. In the latter case, the curing does not occur uniformly so that the non-uniformity is to a certain extent corrected, so that the non-uniformity is reduced after UV curing. Still in other cases, use of CER may induce non-uniformity in a uniform substrate, to anticipate subsequent non-uniform processing.

This determination may be made a number of ways. In one situation where the input is a film property distribution across the substrate, the controller may compare the distribution against those stored in memory and select the angle of reflection that most closely matches the distribution. The controller may also calculate, based on software programming, the best angle to use. In some cases, the CER angle may be determined by an operator. Note that this angle may change over the duration of processing. Thus the determination output may be a number, e.g., the number of degrees for the CER angle, or a timing sequence, e.g., how the angle should change over time.

Generally, non-uniformity on a substrate is determined based on a diameter cross-section. For different diameters, the non-uniformity is the same. Because deposition on a substrate typically involves elements in a shape of a disk, e.g., showerheads, substrates, and substrate supports, each circular section of a substrate typically has the same non-uniformity as the next slice. In other words, film property along perimeters of concentric circles on a substrate is typically the same. However, in some circumstances, complex non-uniformity can develop. Complex non-uniformity, as used herein, is when the film property along a perimeter of a substrate annulus is non-uniform. For example, if a quadrant of a showerhead has a lower flow due to plugged holes, if a substrate is misshapen, e.g., concave, convex, or potato-chip shaped, or if a vacuum foreline is plugged, the film as-deposited may develop complex non-uniformity.

UV curing of substrates that have complex non-uniformity using a substantially uniform irradiation distribution may exacerbate the non-uniformity. In addition to determining an angle of reflection, the controller may move the reflector along the axes of rotation and/or perpendicular to the axes of rotation. These freedoms of motion allow irradiance compensation for most complex non-uniformity cases. When a multiple-station chamber is used, another method to compensate for complex non-uniformity is to use different angles of reflection and/or UV power at each station to target various regions on the substrate.

The CER assembly is then moved, at operation 407 to the angle or position determined in operation 405. The controller sends a signal to the stepper motors to rotate the reflector optics or to move the reflector optics. The CER may be moved prior to UV curing each substrate or only once for an entire batch of substrates. The frequency of adjustment depends on the availability of non-uniformity data. If non-uniformity is known for every substrate, a small operation of moving the reflectors to ensure good film property may be worthwhile. Typically however, non-uniformity information may be known for a batch of substrates. In those circumstances the reflector optics is moved once per batch. Once the reflectors are in place, then the substrate is irradiated with UV light in operation 409 for a specified duration to achieve a certain level of UV cure. The UV radiation that reaches the substrate includes both reflected and unreflected light. The adjustable CER apparatus controls the angle of reflected light and amount of unreflected light to a small portion of the substrate, as shown in FIG. 1D.

The amount of UV cure achieved depends not only on UV light power and irradiance distribution, but also substrate temperature and chamber pressure. As discussed above, UV radiation alters film properties. For silicon nitride film, UV radiation increases its tensile stress by removing certain bonds. For porous dielectric film, UV radiation increases cross-linking and densifies the film, thus shrinking the film. UV radiation is also used to remove porogen from a precursor layer containing a porogen and structure former or backbone, thereby forming a porous dielectric film. UV radiation can also be used to evolve solvents present in a film, such as a spin-on ULK film. Depending on the film treated, alteration of certain film properties, but not all, is desired.

One way to measure UV cure uniformity is the percentage of shrinkage. Given the same amount of material and same film properties, uniform radiation would achieve uniform shrinkage. But when the film varies in thickness or has different properties, the radiation would have to be non-uniform, i.e., compensate for the film non-uniformity, in order to achieve the same percentage of shrinkage at the substrate edge and center. In one example, the CER angle of reflection may be adjusted such that the UV radiation at the substrate center is 50% of that at the substrate edge.

While the film is treated with UV radiation, the reflectors may optionally move to sweep radiation across the substrate surface in operation 411. The reflectors may also move in a translational direction. A sweeping radiation across the substrate may reduce the intensity of hotspots created by the geometry of the linear bulb and circular substrate. After the UV curing is complete, the substrate is removed from the process chamber (415) or optionally transferred to the next station (413) if a multiple-station chamber is used.

Modeling Results

Computer modeling to simulate the effect of a central external reflector (CER) apparatus at different angles of reflection was conducted. The resulting irradiance distributions are FIGS. 5A to 5C. The modeling simulated a substrate being irradiated at four stations where the relative orientation of the UV lamp assembly to the substrate varied from station to station. The modeling also included the use of ring reflectors (element 106 in FIGS. 1A, 1C and 1D).

Figure 5A:
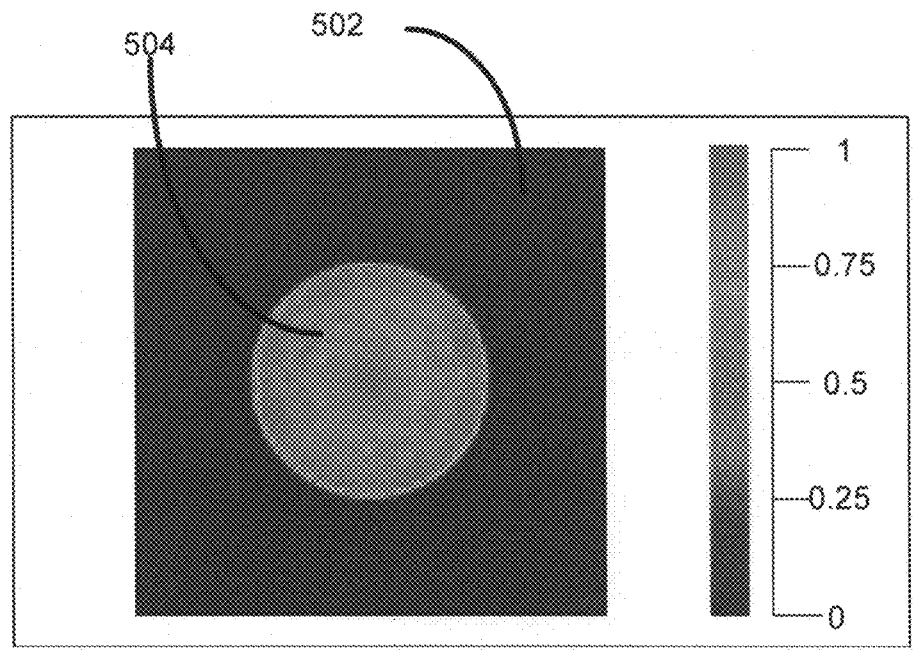
FIGS. 5A to 5C are irradiance intensity results from modeling a CER at different angles.

FIG. 5A is the irradiance distribution when the CER angle is at 45 degrees. As discussed above, at this angle the reflector optics are out of the direct path of the radiation generated. A dark blue indicates no irradiance, such as area 502, and the highest irradiance is normalized as red. FIG. 5A shows a more or less flat irradiance, such as area 504, across the substrate, with small patches of lower irradiance. With the CER angle at 45 degrees, this irradiance distribution resembles that of a substrate without a CER.

Figure 5B:
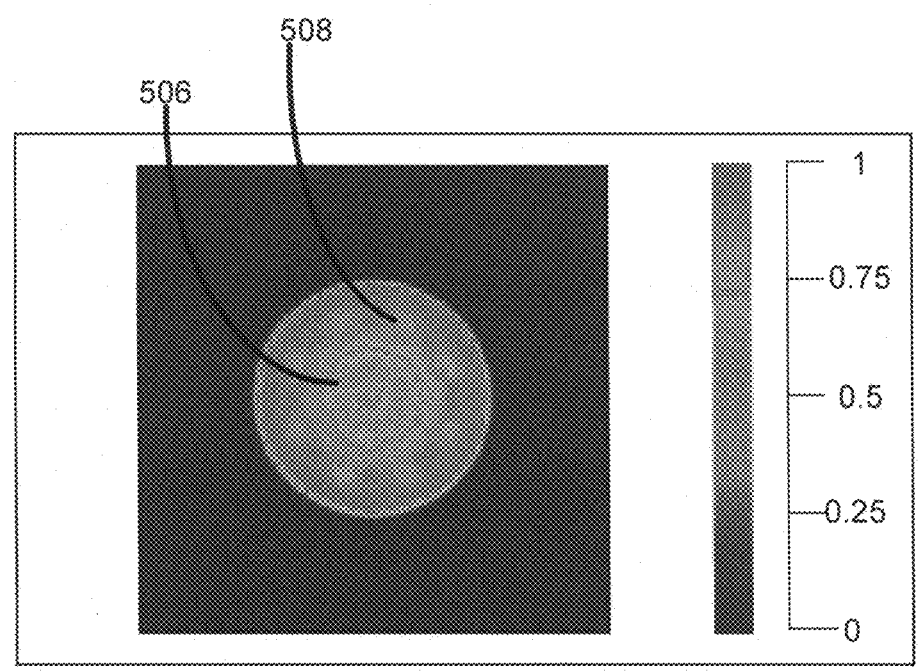

FIG. 5B is the irradiance distribution when the CER angle is at 75 degrees. As discussed above, the CER angle is measured from a plane parallel to the substrate where the reflector optics are furthest away from the UV bulbs. Thus, at 75 degrees, the reflector optics are not yet fully perpendicular to the substrate, but is already reflecting a significant portion of the UV light generated. FIG. 5B shows an area of lower irradiance about the center of the substrate, area 506, and small patches of lower irradiance (508) in an outer annulus of the substrate. The center area of lower irradiance 506 has irradiance about 60% of the maximum.

Figure 5C:
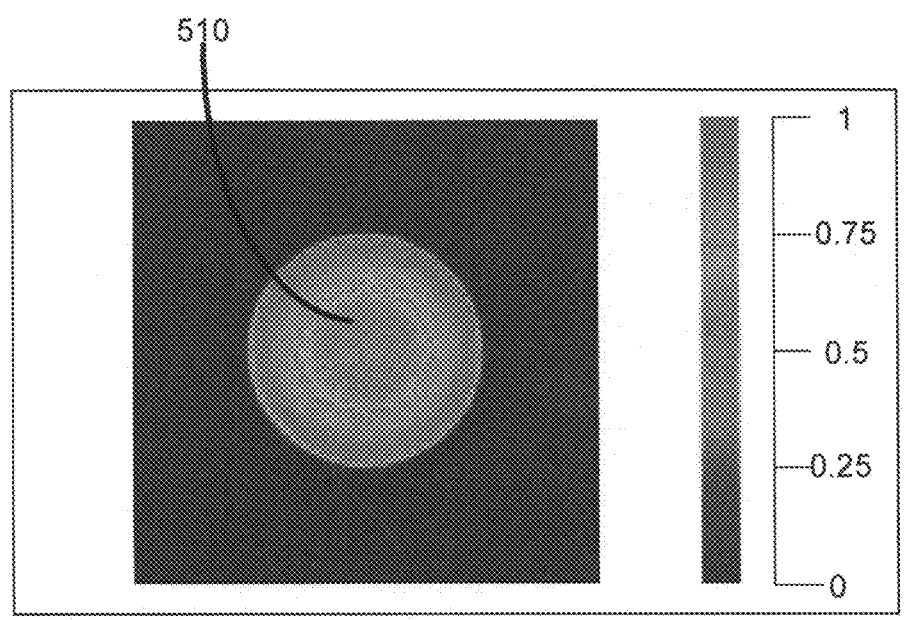

FIG. 5C is the irradiance distribution when the CER angle is at 90 degrees. The reflector optics are perpendicular to the substrate. FIG. 5C also shows an area of lower irradiance about the center of the substrate, area 510. Area 510 is larger than area 506 of FIG. 5B and has lower irradiance, down to about 50% toward the center.

These figures show that by manipulating the CER angle, the size of the lower irradiance region about the center of a substrate can be increased or decreased, and the relative amounts of irradiance can also be changed. Thus one can match a desired irradiance distribution to a CER angle to achieve a level of desired UV cure.

Figure 6:
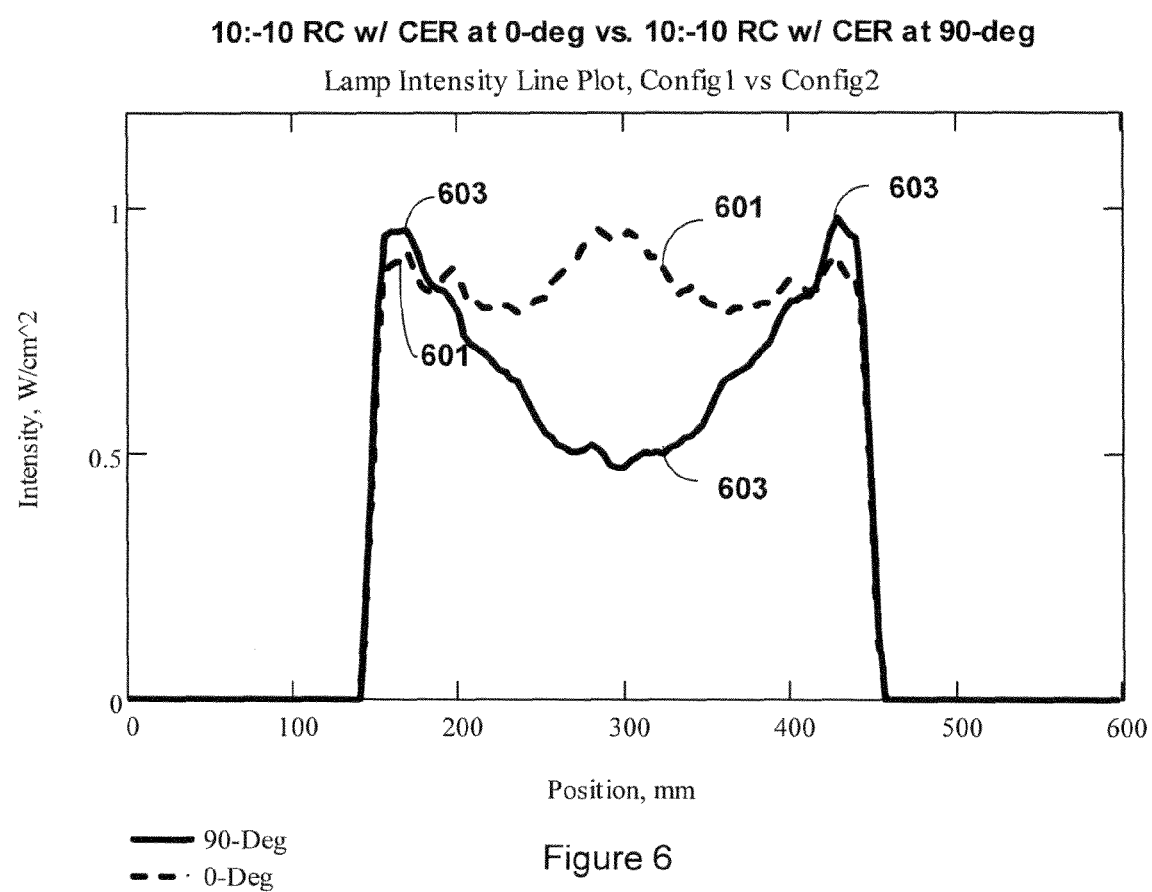
FIG. 6 is a lamp intensity line plot across a substrate with a CER at 0 and 90 degrees.

FIG. 6 is a line plot of the lamp intensity as perceived by a modeled substrate. The x-axis is position on the substrate. In this case a 300 mm substrate is modeled. The y-axis shows the intensity, in units of W/cm$^2$. Line 601 shows the CER angle at 0 degrees, which is parallel to the substrate plane. The intensity for line 601 peaks at the edges and at the center of the substrate, varying from about 0.8 to 1. Line 603 shows the CER angle at 90 degrees, which is perpendicular to the substrate plane. The intensity for line 603 peaks only at the edges and varies from about 0.5 to 0.9. These very different profiles suggest that given a substrate non-uniformity distribution, an irradiance profile may be found to approximate uniform UV curing.

Figure 7:
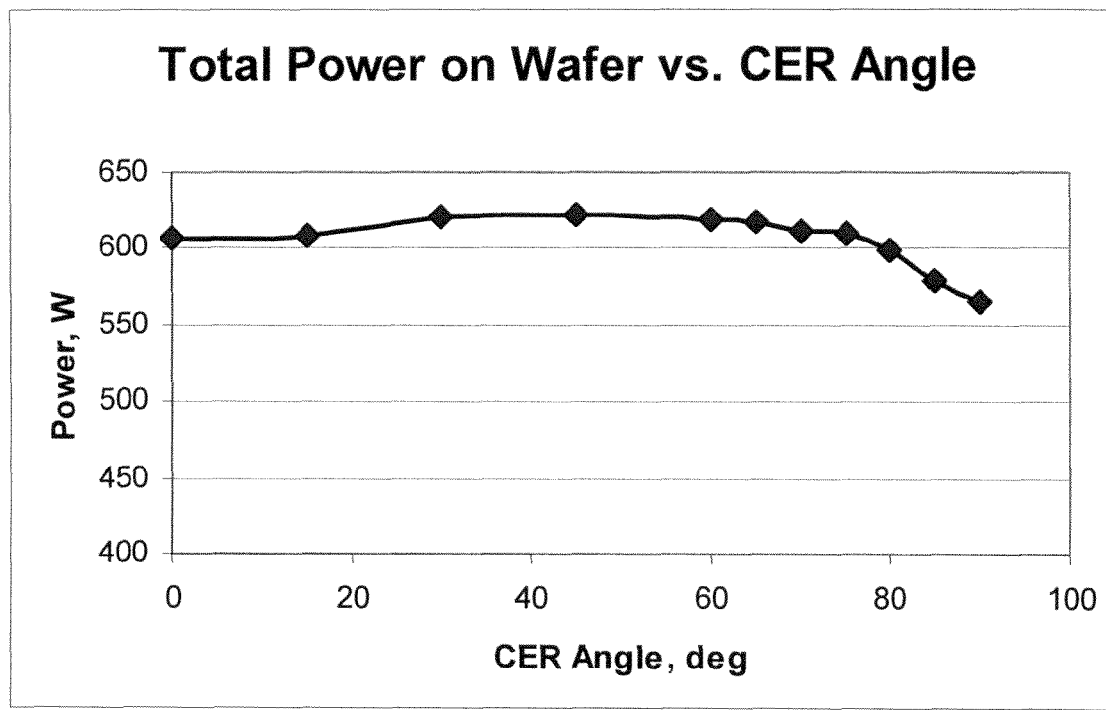
FIG. 7 is a power line plot of total power on a substrate for various CER angles.

Modeling data were also analyzed for total power on wafer versus CER angle. FIG. 7 is a plot of the power in watts versus the CER angle in degrees for 0 to 90 degrees. In each case the input power to the UV bulbs is the same, the actual power transferred to the wafer was modeled. At very low CER angles, the power on wafer varied little, from about 600 W to about 620 W over 60 degrees. Then the power on wafer started to drop, but even at 90 degrees the total power is still at 90% of the maximum. This result shows that the use of CER angle adjustments is an efficient way to redistribute radiative power and shape irradiance profile with little power loss.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A semiconductor processing apparatus comprising:
   (a) a process chamber comprising a substrate holder and a window;
   (b) an ultraviolet (UV) lamp assembly mounted on the process chamber over the window, the UV lamp assembly comprising UV light source and an adjustable reflector; and
   (c) a controller operable to execute a set of instructions, wherein
      the adjustable reflector comprises (i) a rotational adjustment mechanism, wherein the rotational adjustment mechanism includes a stepper motor; and, (ii) reflective optics mounted to the rotational adjustment mechanism, wherein the reflective optics mount is configured to rotate about an axis; and
      the set of instructions comprises (i) receiving an indication of an extent of non-uniformity of a substrate or a substrate batch; (ii) determining an angle of reflection to compensate for the non-uniformity; (iii) moving the rotational adjustment mechanism to the determined angle; and, (iv) radiating the substrate with UV radiation.

2. The semiconductor processing apparatus of claim 1, wherein the axis is parallel to a plane of the substrate holder.

3. The semiconductor processing apparatus of claim 1, wherein the reflective optics mount is a hinge or a pivot joint.

4. The semiconductor processing apparatus of claim 1, wherein the adjustable reflector further comprises a translational adjustment mechanism.

5. The semiconductor processing apparatus of claim 1, wherein the reflective optics are dielectric coated mirrors.

6. The semiconductor processing apparatus of claim 5, wherein the reflective optics are coated with dielectrics designed to reflect UV radiation at wavelengths of about 150-400 nm.

7. The semiconductor processing apparatus of claim 5, wherein the reflective optics are aluminum metal coated with silicon oxide.

8. The semiconductor processing apparatus of claim 1, wherein the reflective optics are metal coated mirrors.

9. A method of UV curing a semiconductor substrate, the method comprising:
   (a) providing a substrate having a non-uniform film deposition in a process chamber having a UV radiation source;
   (b) exposing a substrate with UV radiation reflected by an adjustable reflector associated with the UV source;
   (c) receiving an indication of an extent of non-uniformity of a substrate or a substrate batch;
   (d) determining an angle of reflection to compensate for the non-uniformity;
   (e) adjusting the adjustable reflector to the angle of reflection; and
   (f) adjusting a translational position on the adjustable reflector, wherein the exposing operation and the translational adjusting operation occurs concurrently to sweep reflected UV radiation at different positions across the substrate.

10. The method of claim 9, further comprising:
    (a) measuring a substrate non-uniformity.

11. The method of claim 9, wherein the angle of reflection is correlated to the non-uniformity of the deposited film and wherein the UV radiation compensates for the non-uniformity.

12. The method of claim 9, wherein the UV radiation compensates for the film non-uniformity and cures the film substantially uniformly.

13. A method of UV curing a semiconductor substrate, the method comprising:
    (a) providing a substrate having a non-uniform film deposition in a process chamber having a UV radiation source;
    (b) exposing a substrate with UV radiation reflected by an adjustable reflector associated with the UV source; and
    (c) receiving an indication of an extent of non-uniformity of a substrate or a substrate batch;
    (d) determining an angle of reflection to compensate for the non-uniformity; and
    (e) adjusting the adjustable reflector to the angle of reflection;
    wherein the exposing operation and the adjusting operation occurs concurrently to sweep UV radiation at different angles across the substrate.

14. The method of claim 13, wherein the exposing operation and the translational adjusting operation occurs concurrently to sweep reflected UV radiation at different positions across the substrate.

15. The method of claim 9, further comprising adjusting a horizontal angle of the adjustable reflector relative to a substrate plane.

16. The method of claim 9, further comprising exposing the substrate with UV radiation generated at a different orientation relative to the substrate than a previous exposure operation.

17. The method of claim 9, wherein the UV radiation has wavelengths of about 150-400 nm.

18. The method of claim 9, wherein a substrate center is exposed to less radiation than near a substrate edge.

19. The method of claim 13, further comprising adjusting a translational position on the adjustable reflector.

20. The method of claim 13, further comprising measuring a substrate non-uniformity.

21. The method of claim 13, wherein the angle of reflection is correlated to the non-uniformity of the deposited film and wherein the UV radiation compensates for the non-uniformity.

22. The method of claim 13, further comprising adjusting a horizontal angle of the adjustable reflector relative to a substrate plane.

23. The method of claim 13, further comprising exposing the substrate with UV radiation generated at a different orientation relative to the substrate than a previous exposure operation.

24. The method of claim 13, wherein a substrate center is exposed to less radiation than near a substrate edge.

* * * * *